United States Patent
Hellmer et al.

(10) Patent No.: US 8,674,731 B1
(45) Date of Patent: Mar. 18, 2014

(54) FRACTIONAL PHASE-LOCKED LOOP WITH DYNAMIC DIVIDE RATIO ADJUSTMENT

(71) Applicant: Applied Micro Circuits Corporation, Sunnyvale, CA (US)

(72) Inventors: Michael Hellmer, Carlsbad, CA (US); Simon Pang, San Diego, CA (US); Brian Abernethy, Escondido, CA (US); Yehuda Azenkot, San Jose, CA (US)

(73) Assignee: Applied Micro Circuits Corporations, Sunnyvale, CA (US)

( * ) Notice: Subject to any disclaimer, the term of this patent is extended or adjusted under 35 U.S.C. 154(b) by 0 days.

(21) Appl. No.: 13/747,053

(22) Filed: Jan. 22, 2013

(51) Int. Cl.
*H03L 7/18* (2006.01)
*H03L 7/093* (2006.01)

(52) U.S. Cl.
USPC .......................................... 327/156; 327/147

(58) Field of Classification Search
CPC .......... H03L 7/0891; H03L 7/18; H03L 7/093
USPC ................................................. 327/147, 156
See application file for complete search history.

(56) References Cited

U.S. PATENT DOCUMENTS

| | | | |
|---|---|---|---|
| 6,901,127 B1 * | 5/2005 | Margules | 375/361 |
| 7,702,058 B2 * | 4/2010 | Margules | 375/376 |
| 7,778,371 B2 | 8/2010 | Do et al. | |
| 7,826,563 B2 | 11/2010 | An et al. | |
| 8,497,716 B2 * | 7/2013 | Zhang | 327/156 |
| 2005/0105662 A1 * | 5/2005 | Margules | 375/376 |
| 2009/0157791 A1 | 6/2009 | Do et al. | |
| 2013/0033293 A1 * | 2/2013 | Zhang | 327/156 |
| 2013/0076414 A1 * | 3/2013 | Kato | 327/157 |
| 2013/0300470 A1 * | 11/2013 | Mohajeri et al. | 327/157 |

* cited by examiner

*Primary Examiner* — Adam Houston (57) ABSTRACT

Systems and methods for Phase-Locked Loop (PLL) based frequency synthesizer comprising a dynamic fraction divider in a feedback loop. The dynamic fraction divider employs a dynamic divide ratio that dynamically changes with the jitters and noise spurs contained in an input signal to the PLL, and generates a feedback signal used to adjust the PLL output frequency. The dynamic divide ratio may be determined by comparing the phases of the PLL output signal and the input signal.

28 Claims, 6 Drawing Sheets

FRACTIONAL PHASE-LOCKED LOOP WITH DYNAMIC DIVIDE RATIO ADJUSTMENT

TECHNICAL FIELD

The present disclosure relates generally to the field of electronics, and, more specifically, to the field of phase lock loop circuits and their methods of operations.

BACKGROUND

A Phase-Locked Loop (PLL) is a control system capable of generating an output signal having a phase related to the phase of an input reference signal. PLLs are widely used in communication systems, for example to process clock signals. Depending on the application, a PLL can be implemented in a number of different ways, including fully-analog implementations, fully-digital implementations, software implementations and a mix thereof. Two or more PLLs may be coupled together in implementations for various applications.

A PLL can be configured as a frequency synthesizer that functions to generate a signal with a desired frequency based on a given reference frequency by using a frequency divider in the feedback loop. A fractional-N PLL, in contrast to an integer-N PLL, comprises a fractional divider and may have a frequency conversion factor, e.g., the divide ratio, N being a non-integer.

Typically, a fractional-N PLL frequency synthesizer comprises a phase frequency detector, a loop filter, a voltage controlled oscillator (VCO) and a fractional divider in the feedback loop. The VCO outputs a signal having a frequency that is N times the frequency of a reference signal. The fractional divider divides the output signal by N and generates a feedback signal. The phase frequency detector compares the phase of the reference and the feedback signal, and accordingly outputs an error signal to the loop filter, which is usually a low-pass filter, that sets the loop dynamics, such as bandwidth, damping, and setting time. The loop filter outputs a voltage to the VCO based on the error signal to adjust the frequency of the VCO output. Conventionally, the divide ratio N remains static during the foregoing process.

Unfortunately, an input signal to a PLL often contains a significant amount of undesired phase noises or jitters, primarily coming from analog function blocks in the circuit, which tend to be passed to the output signal via the PLL frequency synthesizer. This causes synchronization issues. The low-bandwidth nature of a conventional jitter attenuator, compounded with relatively low jitter transmit clock frequencies, has made implementation difficult. For example, an analog PLL addressing the jitter performance issue would require complex circuitry and silicon area to enable low bandwidth, which increases cost. A digital PLL addressing this issue would require implementing challenging design linearity specification for a digital control oscillator.

SUMMARY OF THE INVENTION

Therefore, there is a continuing need to improve jitter performance for a PLL based frequency synthesizer.

Accordingly, embodiments of the present disclosure provide systems and methods for PLL based frequency synthesis having attenuated noise spurs and jitters at the output. Embodiments of the present disclosure advantageously comprise a dynamic fractional divider in a feedback loop whose divide ratio is dynamically adjustable with jitters and noises present in an input signal. Thus, the dynamic fractional divider is capable of generating a feedback signal used to adjust the frequency of the output signal of the PLL in response to the jitters and noises contained in the input signal.

In one embodiment of present disclosure, a Phase-Locked Loop (PLL) system comprises a first phase frequency detector, a VCO coupled to the first phase frequency detector through a first low pass filter to generate an output of the PLL, and a fractional divider in the feedback loop. The first phase frequency detector is configured to detect a phase difference between a reference signal and a feedback signal the PLL and generate an error signal. The fractional divider is coupled to the first phase frequency detector and the VCO, and configured to generate the feedback signal by dividing the output signal with a dynamic divide ratio that dynamically changes in response to detection of a phase difference between the input and the output signal. The PLL system further comprises a second phase frequency detector coupled with the fractional divider through a second low-pass filter, configured to detect a phase difference between the input and the output signal, and generate a dynamic offset correspondingly. The dynamic divide ratio equals to the sum of the dynamic offset and a predetermined divide ratio. The fractional divider may comprise a sigma delta modulator and a modulus divider. The signal delta modulator may comprise a Multi-Stage Noise Shaping (MASH), a carry/borrow logic, an integer pipeline and a plurality of adder/subtractors. The modulus divider may comprise a prescaler and a high speed divider.

In another embodiment of present disclosure, a method for frequency synthesis comprises: (1) receiving a reference signal with a first frequency; (2) generating an output signal with a second frequency; (3) receiving an input signal; (4) determining a dynamic divide ratio based on detection of a phase difference between the input and the output signal, where the second frequency is substantially equal to the first frequency times the dynamic divide ratio; (5) generating a feedback signal by dividing the output signal with the dynamic divide ratio; and (6) adjusting the output signal based on detection of a phase difference between the reference and the feedback signal. The method may further comprise modulating the dynamic divide ratio into a random sequence of discrete values to perform the division in generating the feedback signal, where the historical mean of the discrete values equals to the dynamic divide ratio.

In another embodiment of present disclosure, an integrated circuit comprises a PLL logic that comprises a dynamic feedback divider. The dynamic feedback divider is configured to divide an output signal of the PLL with a dynamic divide ratio that changes dynamically in response to a phase difference detected between an input signal of the PLL and the output signal the PLL. A feedback signal is generated based the phase difference. A first phase frequency detector is used to detect a phase difference between the input and the output signals of the PLL, and generate an offset signal. The dynamic divide ratio is a combination of the offset signal and a predetermined ratio. A second phase frequency detector is used to detect a phase difference between a reference signal and the feedback signal generate an error signal which is used to control a VCO and adjust the output signal of the PLL. The dynamic feedback divider may comprise a sigma delta modulator and a modulus divider. The signal delta modulator may comprise a MASH, a carry/borrow logic, an integer pipeline and a plurality of adder/subtractors. The modulus divider may comprise a prescaler and a high speed divider.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Fractional Phase Lock Loop with Dynamic Divide Ratio Adjustment

Figure 1:
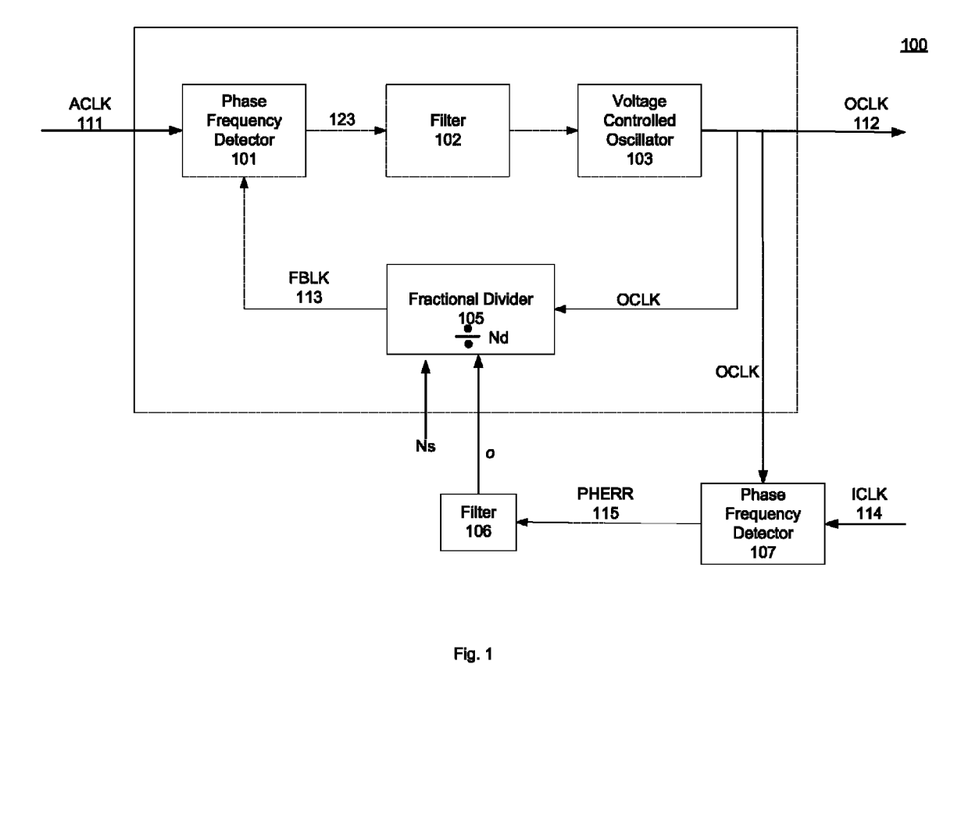
FIG. 1 is a block diagram illustrating a configuration of a fractional-N PLL comprising a dynamic fractional divider in accordance with one embodiment of the present disclosure.

FIG. 1 is a block diagram illustrating a configuration of a fractional-N PLL 100 comprising a dynamic fractional divider 105 in accordance with one embodiment of the present disclosure. The fractional-N PLL 100 comprises a first phase frequency detector 101, a first low-pass filter 102, a VCO 103, a dynamic fractional divider 105 coupled with a second low-pass filter 106 and a second phase frequency detector 107. The general function of the fractional-N PLL 100 includes receiving a reference signal ACLK 111 and an input signal ICLK 114 having jitters and noise spurs, and generating an output signal OCLK 112. The frequency of the OCLK 112 is equal to the frequency of ACLK 111 times a dynamic divide ratio Nd which dynamically changes with the jitters and noise spurs contained in the ICLK 114. Receiving the OCLK 112 as an input, the fractional divider 105 is capable of dividing OCLK 112 with the dynamic divide ratio Nd and thereby generates a feedback signal FBLK 113 that dynamically changes with the Nd. The feedback signal FBLK 113 is then fed to the first phase frequency detector 101 and compared with the reference clock ACLK 111 to supply a phase error signal 123 which dynamically changes with Nd as well. The phase error signal 123 is then forwarded to the VCO 103 through the first low-pass filter 102 and controls the VCO to adjust the output frequency of OCLK 112. Therefore, due to the dynamic nature introduced by the divide ratio Nd employed in the fractional divider 105, the frequency of the OCLK 112 can be dynamically adjusted in accordance with the phase shifts caused by jitters and noise spurs in the ICLK 114, which advantageously reduces jitter accumulation at the OCLK 112.

According to the embodiment illustrated in FIG. 1, the dynamic divide ratio Nd is determined by adding a dynamic offset o to a static divide ratio Ns, i.e., Nd=Ns+o, where the dynamic offset o reflects the jitters and noise spurs carried in the input signal ICLK 114 while Ns may be predetermined by a desired frequency of the OCLK. In this embodiment, the second phase frequency detector 107 compares the phases of the OCLK 112 and the ICLK 114 and generates a phase error signal PHERR 115. The PHERR 115 is filtered via the second low-pass filter 106 and converted to a dynamic offset o. The calculation of Nd is then conducted in the fractional divider 105. In some other embodiments, the dynamic divide ratio can be derived by other suitable means. Nd, Ns and o can be integers, fractions, or complex numbers.

In some embodiments, the reference signal ACLK 111 and input signal ICLK can be clock signals. Alternately, they can be some other types of input signals.

Figure 2:
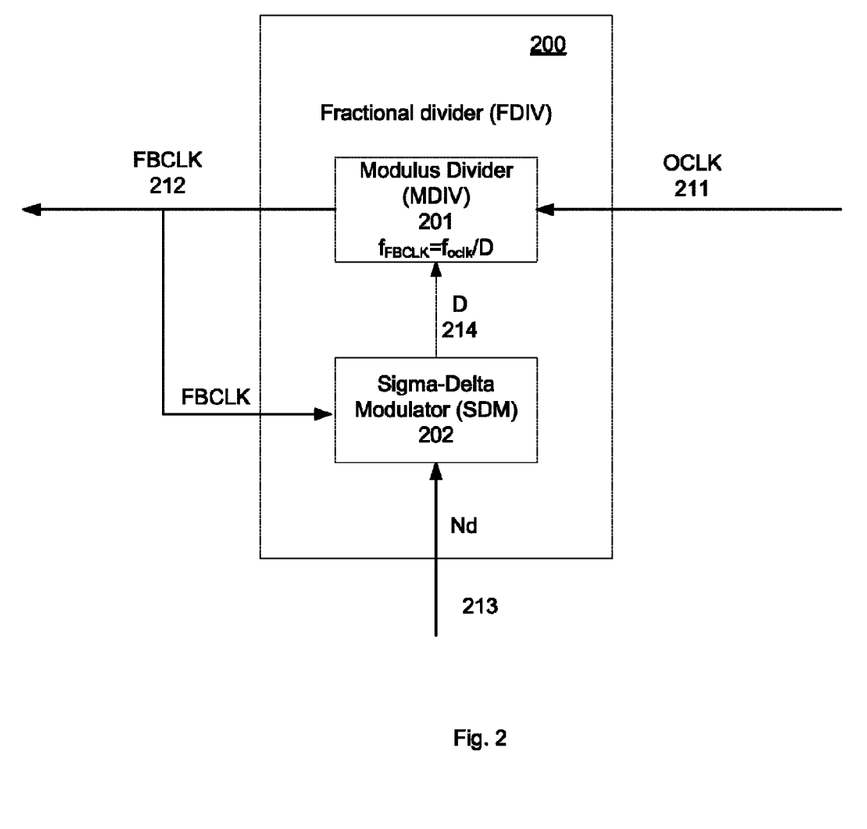
FIG. 2 is a block diagram illustrating a configuration of a dynamic fractional divider in accordance with one embodiment of the present disclosure.

FIG. 2 is a block diagram illustrating a configuration of a dynamic fractional divider 200 in accordance with one embodiment of the present disclosure. As in the embodiment illustrated in FIG. 1, the dynamic fractional divider 200 is disposed in the feedback loop of the PLL and operates to scale down the frequency of output signal OCLK 211 by a dynamic divide ratio Nd and supply a negative feedback signal FBCLK 212. The dynamic fractional divider 200 comprises a modulus divider 201 coupled to a SDM 202.

Figure 3:
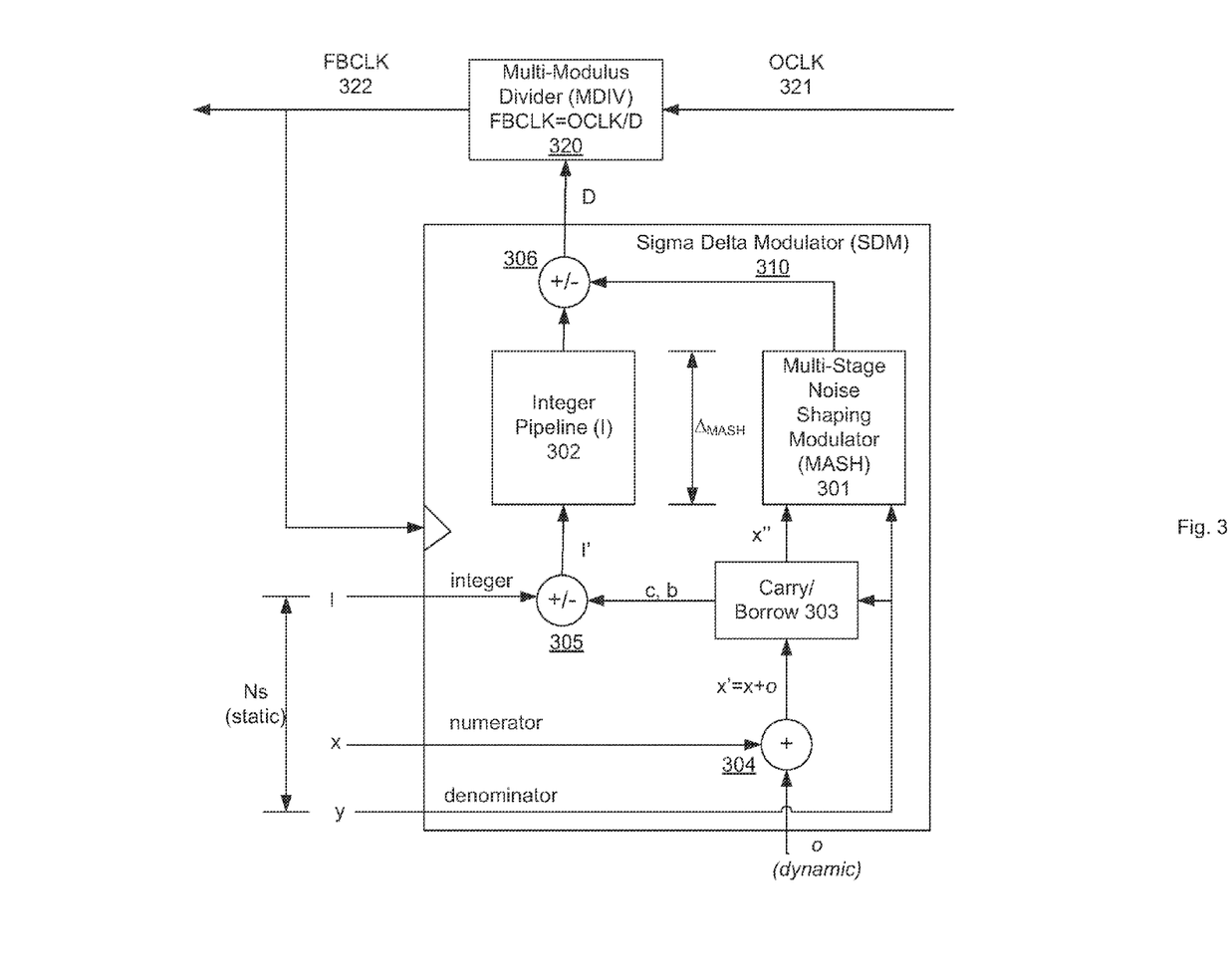
FIG. 3 is a block diagram illustrating a configuration of a Sigma Delta Modulator (SDM) used in a dynamic fractional divider in accordance with one embodiment of the present disclosure.

According to this embodiment, The SDM 202 is configured to modulate the dynamic divide ratio Nd received at an input 213 into a sequence of discrete values Di (i=1, 2, ..., n) 214, or a D sequence, where a historical mean of average of all the Di equals to Nd, for purposes of facilitating hardware clock divider. In some embodiments, D can be simple numbers. In some embodiment, the discrete values in a D sequence can be generated randomly to shape the noise spurs that normally present a random pattern. In some embodiments, the SDM 202 can be clocked by the feedback signal FBCLK 212, as also illustrated in FIG. 3. Thus, a different Di is generated in each feedback cycle, allowing the SDM to dynamically change ratio of the frequency of the OCLK 211 to the frequency of the FBCLK 212.

The resolution of the sequence of Di is not limited to particular numbers to implement this disclosure. However, at least in part, the resolution may be limited by implementation hardware. In some embodiments, a resolution of 0.5 can be achieved by using the positive and the negative edges' of an OCLK. In some other embodiments, a resolution of 0.25 may be achieved using quadrature OCLK phases.

Provided with the D sequence 214 from the SDM 202, the modulus divider 201 can divide the OCLK 211 with each Di respectively, and thereby generates a respective FBCLK 212 in each feedback cycle.

FIG. 3 is a block diagram of a dynamic fractional divider 300 illustrating the configuration of a SDM 301 operable to provide a sequence of discrete values Di (i=1, 2, ..., n) in accordance with one embodiment of the present disclosure. The SDM 310 comprises a Multi-Stage Noise Shaping Modulator (MASH) 310, an integer pipeline 302, a carry/borrow logic 303 and a plurality of adder/subtractors including 304, 305 and 306. The implementation of a MASH module is known by those having ordinary skills in the art.

According to this embodiment, the static divide ratios Ns is decomposed into an integer portion (I) and a rational fraction portion (x/y, or a floating number F), expressed as I+(x/y) or I. F, where I, x, y are all constants. The integer I is fed to an adder/subtractor 305 in the integer path, the numerator x and the denominator y is fed to the modulation path comprising the MASH 301 coupled to a carry/borrow logic and the adder/subtractor 304. The dynamic offset o is added to x at the adder/subtractor 304 to generate a new numerator x'=x+o, where o can be a signed value.

In some embodiments, the MASH 301 requires its input to be greater than or equal to 0 and less than 1. Thus if x' is greater than or equal to 1, the carry/borrow logic generates an integer carry c and a reduce numerator x" is provided to the MASH 301, where $$c = \left\lfloor \frac{x'}{y} \right\rfloor$$

$$I' = I + c$$

$$x'' = x' - (c \times y).$$

On the other hand, if x' is less than 0 then an integer borrow b is generated to adjust the new numerator x' to a reduced numerator x", where $$b = \left\lceil \frac{|x'|}{y} \right\rceil$$

$$I' = I - b$$

$$x'' = x' - (b \times y).$$

Provided with x" and y, the MASH 301 modulates x"/y into a sequence of discrete numbers, which are then respectively summed with I' supplied by the integer pipeline 302 at the adder/subtractor 306 to generate a respective Di value to be supplied to the modulus divider 320.

The MASH 301 may have a number of pipeline delays. A change on the numerator x" (with possible consequential change in the integer due to carry/borrow) will take $\Delta_{MASH}$ FBCLK cycles to propagate to the MASH output. This delay can be matched in the integer pipeline 302 to keep the integer and modulation paths synchronized, for example, the integer path stay in phase with the modulation path for each feedback cycle.

The multi-modulus divider (MDIV) 320 is responsible for dividing down OCLK 321 by a D sequence to generate the FBCLK 322. In some embodiments, the MDIV 320 is a mixed signal module comprising both digital and analog components to suit the requirements the high speed nature of the output signal OCLK. The digital portion may comprise a pre-scaler (not shown) which can further convert each input Di into a sequence of discrete OCLK divide values PSj (j=1, 2, ..., l), or a PS sequence. The analogy portion may comprise a modulus divider (not shown) which receives the sequence of PSj, and divide the OCLK 321 by the amount specified by the prescaler, expressed as $$f(FOUTj) = \frac{f(OCLK)}{PSj},$$

where the FOUT clock of the analog divider is further divided down by the pre-scaler to generate one cycle of the FBCLK for each PS sequence of length l, expressed as $$f(FBCLK) = \frac{1}{\sum_{j=1}^{l} \left( \frac{1}{f(FOUTj)} \right)},$$

where l is the length of the PS sequence.

For example, to generate FBLCK=OCLK/63.5, the pre-scaler could generate an FOUT divide pattern of PS={8, 8, 8, 8, 8, 8, 8, 7.5}. The sum of the elements of the PS sequence is 63.5 and the length of the sequence is 8. For each FOUT clock cycle the pre-scaler sends the next element of the sequence to the analog divider to select the OCLK divide for the next period of FOUT. In this example, FOUT would have the sequence of {OCLK/8, OCLK/8, OCLK/8, OCLK/8, OCLK/8, OCLK/8, OCLK/8, OCLK/8, OCLK/7.5}. The digital pre-scale generates one cycle of FBCLK over the length l of the PS sequence, which would be OCLK/63.5 in the example.

Figure 4:
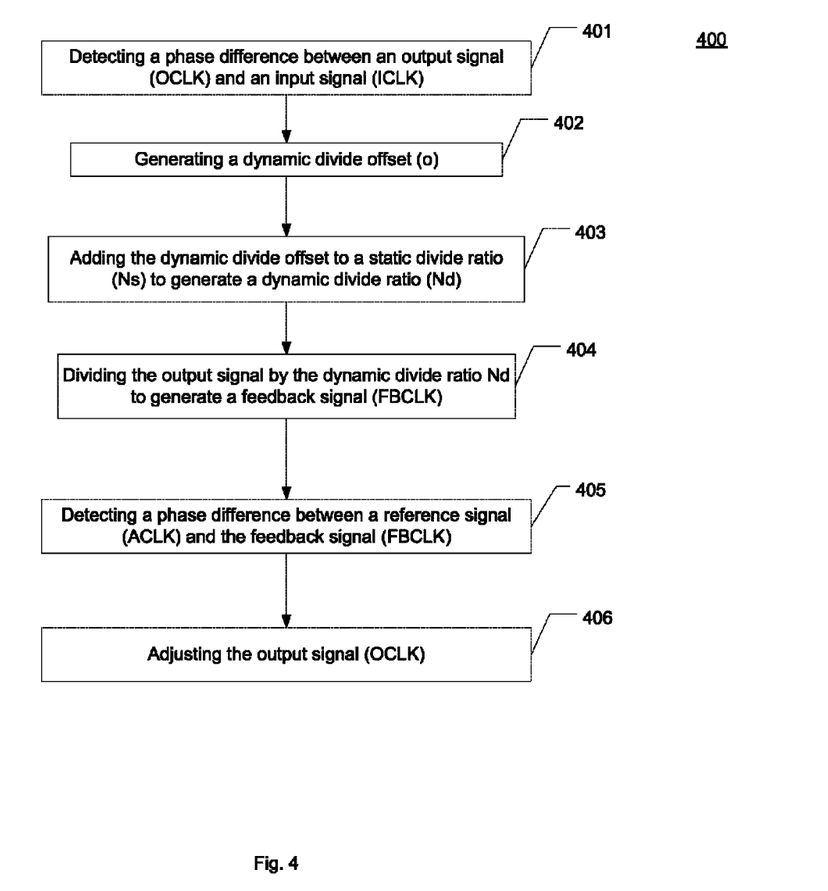
FIG. 4 is a flow diagram of illustrating the method for adjusting an output signal of a PLL frequency synthesizer using a dynamic divide ratio in the feedback loop in accordance with one embodiment of the present disclosure.

FIG. 4 is a flow diagram illustrating the method 400 for adjusting an output signal ICLK of a PLL frequency synthesizer using a dynamic divide ratio in the feedback loop in accordance with one embodiment of the present disclosure. At 401, an input signal ICLK is compared to an output signal OCLK, and a phase difference may be detected. At 402, a dynamic divide offset o is generated corresponding to the detected phase difference between the ICLK and the OCLK. The dynamic divide offset o is added to the static divide ratio Ns to generate a dynamic divide ratio Nd at 404. In some embodiment, Ns may be a predetermined number independent of the jitters and noise spurs in the ICLK. However, it can be appreciated by persons with ordinary skills in the art that a dynamic divide ratio Nd that varies with the jitters and noise spurs in an input clock can be produced in a number of other methods in some other embodiments. At 404, the output signal is divided by Nd to generate a feedback signal (FBCLK) for the PLL frequency synthesizer. At 405, The FBCLK is compared to a reference clock ACLK and a phase difference may be detected. At 406, the output signal OCLK of the frequency synthesizer is adjusted in response to the detected phase difference between the FBCLK and the ACLK. Thus the jitters and the noise spurs in the ICLK are advantageously attenuated in the OCLK.

Figure 5:
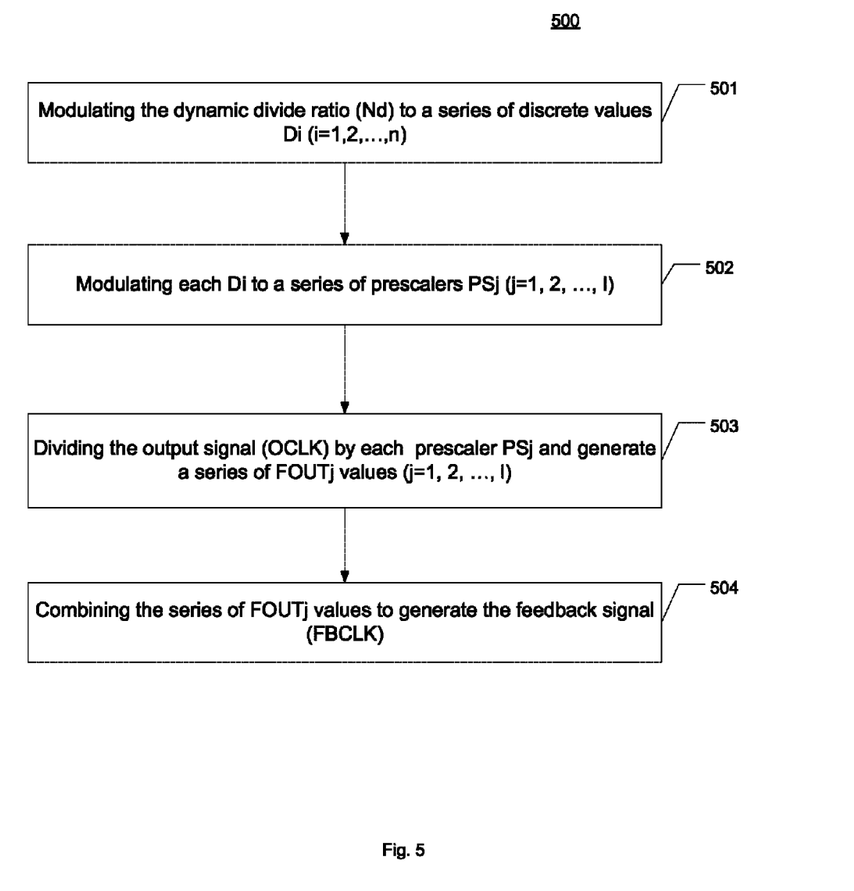
FIG. 5 is a flow diagram of illustrating the method for generating a feedback signal using a dynamic divide ratio in a PLL frequency synthesizer in accordance with one embodiment of the present disclosure.

FIG. 5 is a flow diagram illustrating a method 500 for generating a feedback signal using a dynamic divide ratio in a dynamic fraction divider in accordance with one embodiment of the present disclosure. This method is similar with the 404 in FIG. 4. At 501, a dynamic divide ratio Nd is modulated into a D sequence comprising discrete values Di (i=1, 2, ..., n). Each Di is further modulated into a PS sequence comprising discrete prescalers PSj (j=1, 2, ..., l). The OCLK is divided by each PSj and thereby a corresponding FOUT j value is generated at 503. The FOUT j values are then combined to generate the feedback signal at 504.

Figure 6:
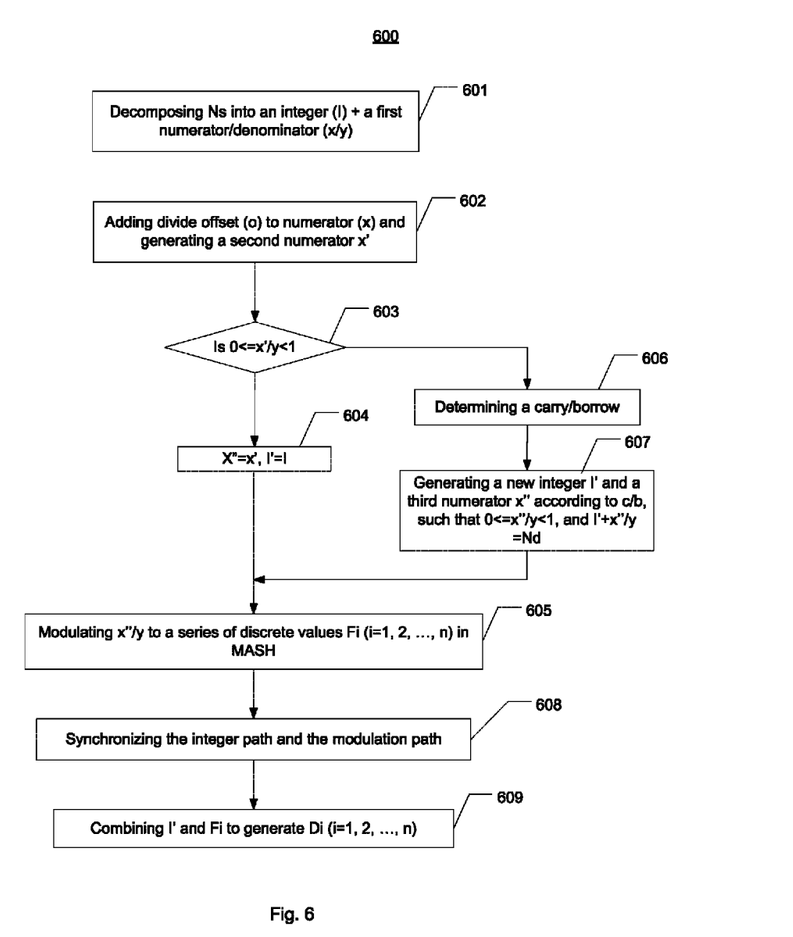
FIG. 6 is a flow diagram of illustrating the method for modulating the dynamic divide ratio to a series of discrete values that are used in a PLL frequency synthesizer in accordance with one embodiment of the present disclosure.

FIG. 6 is a flow diagram illustrating a method 600 for modulating the dynamic divide ratio Nd to a sequence of discrete Di values in accordance with one embodiment of the present disclosure. In this method, the integer portions and the fraction portions of Ns and Nd are processed separately. The fraction portion of Nd is modulated into a sequence of discrete numbers which are recombined with the integer portion to generate the D sequence.

At 601, a static divide ratio Ns is decomposed into an integer I, a numerator x, and a denominator y. A dynamic divide ratio offset o is added to x to generate a second numerator x' at 602. If the relationship 0≤x'/y<1 is satisfied, x' becomes x" and I becomes I'. If not, a carry/borrow is determined, and x" and I' are determined correspondingly. At this point, x"/y and I' represent the fraction portion and the integer portion of the Nd respectively. The fraction portion x"/y is modulated into a series of discrete values Fi (i=1, 2, ..., n), for example, in MASH at 605. At 606, the integer path and the modulation path are synchronized. At 609, I' and each Fi are recombined to generate a corresponding Di.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A Phase-Locked Loop (PLL) system comprising:
    a first phase frequency detector configured to detect a phase difference between a reference signal and a feedback signal of said PLL system, and generate an error signal based on said phase difference;
    a voltage controlled oscillator (VCO) coupled to said first phase frequency detector through a first low-pass filter, and configured to generate an output signal of said PLL system responsive to said error signal; and
    a fractional divider, coupled to said first phase frequency detector and said VCO, said fractional divider configured to generate said feedback signal by dividing said output signal with a dynamic divide ratio that dynamically changes in response to detection of a phase difference between said output signal of said PLL system and an input signal of said PLL system.

2. The PLL system as described in claim 1 further comprising a second phase frequency detector coupled with said fractional divider through a second low-pass filter, configured to detect said phase difference between said input signal and said output signal, and generate a dynamic offset corresponding to said phase difference between said input signal and said output signal, and wherein said dynamic divide ratio is a sum of said dynamic offset and a predetermined divide ratio.

3. The PLL system as described in claim 2, wherein said fractional divider comprises:
    a sigma delta modulator, configured to convert said dynamic divide ratio to a series of discrete values, an average of said series of discrete values substantially equal to said dynamic divide ratio, and
    a modulus divider configured to divide said output signal by said series of discrete values, and generate said feedback signal accordingly.

4. The PLL system as described in claim 3, wherein said sigma delta modulator is clocked by said feedback signal.

5. The PLL system as described in claim 3, wherein each of said series of discrete values is generated arbitrarily in a respective clock cycle.

6. The PLL system as described in claim 3, wherein the resolution of said series of discrete values is a fractional number.

7. The PLL system as described in claim 3, wherein said predetermined number is a rational number, and wherein further said series of discrete values are rational numbers.

8. The PLL system as described in claim 7 further comprising a decoding logic coupled to said sigma delta modulator and configured to decompose said predetermined divide ratio into a first integer and a first fraction, wherein said sigma delta modulator comprises a MASH coupled to a carry/borrow logic and an integer pipeline, said sigma delta modulator configured to receive said first integer, said first fraction and said dynamic offset, and generate each of said series of discrete divide ratios in the form of an integer portion adding a fraction portion.

9. The PLL system as described in claim 3, wherein said modulus divider comprises:
    a prescaler configured to convert each of said series of discrete values to a series of prescaler values, wherein a sum of said series of prescaler values substantially equals to each respective discrete value of said series of prescaler values, and
    a divider configured to divide said output signal by each of said series divide values and generate said feedback signal correspondingly.

10. The PLL system as described in claim 9, wherein said divider and said prescaler are configured to allow for a cycle resolution of 0.5.

11. A method for frequency synthesis comprising:
receiving a reference signal with a first frequency;
generating an output signal with a second frequency;
receiving an input signal;
determining a dynamic divide ratio based on detection of a phase difference between said input signal and said output signal, wherein said second frequency is substantially equal to said first frequency times said dynamic divide ratio;
generating a feedback signal by dividing said output signal by said dynamic divide ratio; and
adjusting said output signal based on detection of a difference in phase between said reference signal and said feedback signal.

12. The method as describe in claim 11 wherein determining said dynamic divide ratio comprising:
determining a dynamic offset based on detection of a phase difference between said input signal and said output signal, and
summing said dynamic offset with a predetermined divide ratio.

13. The method as describe in claim 12 wherein said dynamic offset is a signed value.

14. The method as describe in claim 12, wherein generating said feedback signal comprises:
modulating said dynamic divide ratio to a series of discrete values, an average of said series of discrete values substantially equal to said dynamic divide ratio; and
dividing said output signal by each of said series of discrete values.

15. The method as describe in claim 14, wherein said series of discrete values comprise a series of random values.

16. The method as describe in claim 15, wherein each of said series of discrete values is a simple rational number and has a fractional number resolution.

17. The method as describe in claim 16, wherein modulating said dynamic divide ratio to a series of discrete values comprises:
generating a first integer and a first fraction, a sum of said first integer and said first fraction substantially equal to said dynamic divide ratio;
modulating said first fraction into a series of modulated fractions in a MASH; and
summing each of said series of modulated fractions with said first integer.

18. The method as describe in claim 17, wherein generating said first integer and said first fraction comprises:
receiving a second integer and a second fraction, a sum of said second integer and said second fraction substantially equal to said predetermined divide ratio;
adding said dynamic offset to said second fraction to generate a third fraction; and
generating a carry signal if said third fraction is greater than 1; generating a borrow signal if said third fraction is less than 0;
combining said second integer with said carry signal or said borrow signal to generate said first integer; and
modifying said third fraction based on said carry signal or said borrow signal to generate said first fraction.

19. The method as describe in claim 14, wherein dividing said output signal by each of said series of discrete values comprises:
modulating each of said series of discrete values into a respective sequence of prescaler values, the sum of said respective sequence of prescaler values substantially equal to each respective discrete value of said series of discrete values, and
dividing said output signal by each of said sequence of prescaler values to generate a series of divided signals; and
combining said series of divided signals into said feedback signal.

20. The method as describe in claim 11, wherein said input signal comprises a jittering component.

21. An integrated circuit comprising a Phase-locked loop (PLL) logic that comprises a feedback divider, wherein said feedback divider is configured to
divide an output signal of said PLL by a dynamic divide ratio that changes dynamically in response to a phase difference detected between an input signal of said PLL logic and said output signal of said PLL logic; and
generate an feedback signal in accordance with said phase difference.

22. The integrated circuit as described in claim 21, wherein said feedback divider is a fractional divider.

23. The integrated circuit as described in claim 21 further comprising:
a first phase frequency detector configured to detect a phase difference between said output signal of said PLL and said input signal of said PLL, and generate an offset signal; and
a first low pass filter coupled between said first phase frequency detector and said feedback divider and configured to filter said offset signal to a filtered offset signal and forward said filtered offset signal to said feedback divider, wherein said dynamic divide ratio is a combination of said offset and a predetermined ratio.

24. The integrated circuit as described in claim 21, wherein said PLL further comprises:
a second phase frequency detector coupled to a reference signal and said feedback signal and configured to generate an error signal;
a low pass filter coupled to said error signal and configured to generate a filtered error signal; and
a VCO coupled to said filtered error signal and generate said output signal.

25. The integrated circuit as described in claim 24, wherein said feedback divider comprises a sigma delta modulator configured to convert said dynamic divide ratio to a plurality of discrete values, wherein an average of said plurality of discrete values substantially equals to said dynamic divide ratio, and wherein further said plurality of discrete values are generated randomly.

26. The integrated circuit as described in claim 25, wherein said feedback divider further comprises a modulus divider comprising a prescaler and a high speed divider, wherein said prescaler is configured to modulate each of said plurality of discrete values into a respective sequence of prescaler values, the sum of said respective sequence of prescaler values substantially equal to each respective discrete value of said series of discrete values, and wherein further said high speed divider is configured to dividing said output signal by each of said sequence of prescaler values.

27. The integrated circuit as described in claim 25, wherein said a sigma delta modulator comprises a carry/borrow logic, an accumulator, a MASH, and an integer pipeline.

28. The integrated circuit as described in claim 27, said integer pipeline is programmed to compensate delay mismatch between said MASH and said accumulator.

* * * * *